March 18, 1969 R. L. ZANOWICK ET AL 3,433,684
MULTILAYER SEMICONDUCTOR HETEROEPITAXIAL STRUCTURE
Filed Sept. 29, 1966
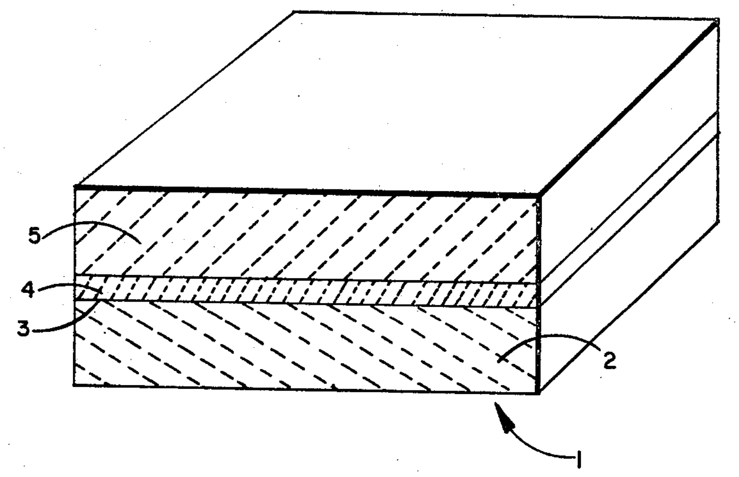
INVENTORS
RICHARD L. ZANOWICK
FRED L. MORRITZ
JESSE E. COKER
Howard A. Silber
ATTORNEY

United States Patent Office 3,433,684

Patented Mar. 18, 1969

3,433,684

MULTILAYER SEMICONDUCTOR HETERO-EPITAXIAL STRUCTURE

Richard L. Zanowick, Orange, Jesse E. Coker, Anaheim, and Fred L. Morritz, Fullerton, Calif., assignors to North American Rockwell Corporation Filed Sept. 29, 1966, Ser. No. 582,955
U.S. Cl. 148—33.4 12 Claims
Int. Cl. H01l 7/36, 3/12

ABSTRACT OF THE DISCLOSURE

A multilayer heteroepitaxial structure comprising a monocrystalline electrically insulating substrate, a monocrystalline semiconductor thin film epitaxially disposed on at least part of the substrate, and a monocrystalline III–V compound epitaxially disposed atop the thin film.

This invention relates to a multilayer thin film semiconductor structure, and more particularly to a composite including a single crystal, electrically insulating substrate, an oriented semiconductor thin film disposed on the substrate, and a monocrystalline layer of a III–V compound epitaxially grown on the thin film. The invention also relates to a process for promoting epitaxial growth of III–V compounds on monocrystalline electrically insulating substrates.

While various III–V semiconductors have been grown epitaxially directly on semiconductor substrates, previous attempts to grow such III–V compounds epitaxially on single crystal, electrically insulating substrates have met with little success. The inventive process described herein enables epitaxial III–V semiconductor layers to be grown on such monocrystalline, electrically insulating substrates. The resultant structures are useful, for example, as radiation recombination lasers. They may also be used in microwave or optical devices, including generators and amplifiers, utilizing the Gunn effect, which effect is described in U.S. Patent No. 3,262,059 to Gunn.

It is thus an object of this invention to provide a method for facilitating the epitaxial growth of III–V semiconductor layers on monocrystalline, electrically insulating substrates.

It is another object of this invention to provide a multilayer semiconductor structure.

It is yet another object of this invention to provide a structure in which a layer of III–V semiconductor material is grown epitaxially on an oriented semiconductor thin film which thin film is disposed on a monocrystalline, electrically insulating substrate.

Another object of this invention is to provide a multilayer structure including a single crystal, electrically insulating substrate, an oriented thin film of germanium disposed on the substrate, and an epitaxial layer of a III–V compound grown on the thin film.

Further objects and features of the invention will become apparent from the following description and drawing which are utilized for illustrative purposes only.

The figure shows a greatly enlarged section of a composite of this invention.

Referring to the figure, it may be seen that the multilayer semiconductor structure 1 comprises a substrate 2 of single crystal, electrically insulating material. Substrate 2 preferably is of BeO, however other monocrystalline insulating materials such as alpha-alumina (sapphire, $Al_2O_3$), and spinel also are satisfactory. Each of these is a metal oxide with either a cubic or hexagonal crystalline structure. The substrate should be cut such that the face 3 on which semiconductor thin film 4 is to be prepared is parallel to one of the crystallographic planes of substrate 2. For example, should BeO be used, face 3 of substrate 2 may be prepared parallel to the (10$\bar{1}$0), (10$\bar{1}$1), or (10$\bar{1}$4) planes.

In the past, attempts to grow an epitaxial layer of a III–V compound directly on a single crystal, electrically insulating material such as substrate 2 have been unsuccessful. However, we have found that if a thin film 4 (see the figure) of a semiconductor material first is deposited on face 3 of substrate 2, a III–V compound readily may be grown epitaxially atop the thin film 4.

Thin film 4 preferably is of Ge, however other semiconductor materials such as Si also may be used. While films 4 only several hundred Angstroms thick are sufficient to promote satisfactory growth of a III–V semiconductor layer 5, thicker films may be used if desired. Films of several hundred Angstroms are too thin to allow determination of their crystallographic orientation by common X-ray Laue pattern analysis. However, surface studies of such thin films 4 suggests that the semi-conductor material of film 4 does exhibit an oriented crystalline structure. Of course, should semiconductor film 4 have a thickness greater than several hundred Angstroms, single crystal orientations may be established by X-ray Laue studies.

Thin film 4 may cover the entire surface 3 of substrate 2 over which a layer 5 of III–V compound is desired. However, a function of film 4 apparently is that of providing nucleation centers for growth thereon of a monocrystalline III–V semiconductor layer, thus thin film 4 need not cover the entire surface 3 of substrate 2.

Layer 5 (see the figure) of multilayer structure 1 comprises an epitaxial, monocrystal of a III–V compound grown on top of thin film 4. The III–V compounds which may be used include, but are not limited to GaAs, GaP, and InSb. These III–V compounds may be deposited on thin film 4 using, for example, a chemical vapor transport technique as described herein below. Epitaxy of layer 5 has been confirmed by three circle goniometer scintallation counter studies.

Should germanium be used as the material for thin film 4, the film may be prepared by the decomposition of $GeH_4$ in a vertical reactor flowing system. Using this technique, substrate 2 is placed in a vertical reactor with its face 3 in a horizontal plane facing upstream. After initial evacuation of the system, substrate 2 is heated to between 500° C. and 800° C. and as the flowing $GeH_4$ decomposes, an oriented crystalline film of Ge will be deposited on the substrate.

Epitaxial III–V semiconductor layer 5 may be grown on the two layer combination including substrate 2 and thin film 4 by using a chemical vapor transport technique over a temperature gradient. For example, should GaAs be selected as the material for layer 5, this layer may be grown epitaxially by suspending the two layer combination above a solid GaAs source in an evacuated chamber, with thin film 4 facing the GaAs source. Close spacing, for example ¼ inch, is desirable between the GaAs source and thin film 4.

Vapor transport of the source material may be achieved using HCl as the transporting agent in a slow flowing (e.g., 50 cubic centimeters per minute) stream of $H_2$ gas. The GaAs source should be heated to slightly above its decomposition temperature, while the composite including substrate 2 and thin film 4 is maintained at a temperature some 50° C. to 100° C. lower than that of the GaAs source.

Transport takes place in a vertical manner. The HCl reacts with the GaAs source to form chlorides of Ga, which together with the gaseous As are transported across the temperature gradient to the surface of thin film 4. Recombination of the Ga and As occurs, and GaAs deposits on surface of thin film 4. As the GaAs grows on the nucleation centers provided by the semiconductor material of thin film 4, some surface diffusion may occur. For this reason, it is desirable to have a low GaAs concentration, so that as the GaAs deposits the material has time to arrange itself into a single crystal form. Too rapid deposition of GaAs results in a pile up effect, and monocrystallinity may not be achieved. Since the surface diffusion effect also is temperature dependent, increasing with temperature, the deposition rate may be controlled either by varying the HCl flow rate or by changing the temperature of the GaAs source and/or the substrate. The thickness of deposited layer 5 is determined by the time duration of deposition.

The crystallographic orientation of III–V semiconductor layer 5 of structure 1 is influenced by the particular plane parallel to which face 3 of substrate 2 has been cut. For example, when BeO, Ge and GaAs respectively are used as the materials for substrate 2, thin film 4 and epitaxial layer 5, the crystallographic planes listed in the following table have been observed to be parallel. In each case, the Ge film was too thin to allow determination of its orientation.

| BeO | GaAs |
|---|---|
| $10\bar{1}0$ | 001 |
| $10\bar{1}1$ | 110 |
| $10\bar{1}4$ | 119 |

As another example of the inventive multilayer monocrystalline structure, single crystal layers of GaP or GaAs have been grown epitaxially on a thin film 4 of germanium, and a substrate 2 of sapphire. In these structures, the sapphire substrate 2 was prepared with its face 3 parallel to the basal plane. The germanium thin film 4 was sufficiently thick to determine that its 111 crystallographic plane was parallel to the sapphire basal plane. The III–V layer 5, whether GaP or GaAs, was found to have its 111 plane parallel to the 111 plane of germanium thin film 4.

Although the invention has been described and illustrated in detail, it is to be clearly understood that the same is by way of illustration and example only and is not to be taken by way of limitation, the spirit and scope of this invention being limited only by the terms of the appended claims.

We claim:

1. In combination, a monocrystalline, electrically insulating substrate;

a monocrystalline, semiconductor thin film epitaxially disposed on most of a portion of said substrate; and a monocrystalline III–V compound epitaxially disposed atop said portion of said thin film.

2. In combination, a monocrystalline, electrically insulating substrate;

a single crystal thin film epitaxially disposed on said substrate; and a III–V compound epitaxially disposed on said thin film.

3. The combination as defined by claim 1 wherein said thin film is one of germanium.

4. The combination as defined by claim 1 wherein said thin film is one of silicon.

5. The combination as defined by claim 1 wherein said substrate is selected from the class consisting of BeO, sapphire and spinel.

6. The combination as defined by claim 1 wherein said III–V semiconductor is selected from the group consisting of GaAs, GaP and InSb.

7. The combination comprising:

a substrate of monocrystalline BeO;

a monocrystalline thin film of Ge epitaxially disposed on said substrate; and, an epitaxial layer of GaAs disposed on said thin film.

8. The combination as defined by claim 8 wherein the 001 crystallographic plane of said GaAs is parallel to the $10\bar{1}0$ plane of said BeO.

9. The combination as defined by claim 8 wherein the 110 crystallographic plane of said GaAs is parallel to the $10\bar{1}1$ plane of said BeO.

10. The combination as defined by claim 8 wherein the 119 crystallographic plane of said GaAs is parallel to the $10\bar{1}4$ plane of said BeO.

11. The combination comprising a substrate of a single crystal sapphire;

a thin film of Ge epitaxially disposed on said substrate; and an epitaxial layer of GaP disposed on said thin film.

12. The combination as defined by claim 11 wherein the 111 crystallographic plane of said Ge is parallel to the basal plane of said sapphire, and wherein the 111 crystallographic plane of said GaP is parallel to the 111 plane of said Ge.

References Cited

UNITED STATES PATENTS

| | | | |
|---|---|---|---|
| 3,072,507 | 1/1963 | Anderson et al. | 148—33 |
| 3,209,215 | 9/1965 | Esaki. | |
| 3,224,913 | 12/1965 | Ruehrwein | 148—175 |
| 3,262,059 | 7/1966 | Gunn. | |
| 3,293,092 | 12/1966 | Gunn. | |
| 3,312,572 | 4/1967 | Norton | 117—106 |

L. DEWAYNE RUTLEDGE, *Primary Examiner.*

R. LESTER, *Assistant Examiner.*

U.S. Cl. X.R.

148—33, 33.3; 117—106; 317—234, 235